United States Patent [19]
Suzuki et al.

[11] Patent Number: 5,387,804
[45] Date of Patent: Feb. 7, 1995

[54] LIGHT EMITTING DIODE

[75] Inventors: Akira Suzuki, Nara; Katsuki Furukawa, Sakai; Mitsuhiro Shigeta, Joyo; Yoshihisa Fujii, Nara, all of Japan

[73] Assignee: Sharp Kabushiki Kaisha, Osaka, Japan

[21] Appl. No.: 944,794

[22] Filed: Sep. 14, 1992

Related U.S. Application Data

[63] Continuation of Ser. No. 648,234, Jan. 30, 1991, abandoned, which is a continuation of Ser. No. 455,565, Dec. 22, 1989, abandoned.

[30] Foreign Application Priority Data

Dec. 28, 1988 [JP] Japan ................... 63-333698

[51] Int. Cl.$^6$ .................. H01L 33/00; H01L 29/161; H01L 29/20; H01L 29/22
[52] U.S. Cl. ........................ 257/77; 257/461
[58] Field of Search .............. 357/17, 61; 257/77, 257/461

[56] References Cited

U.S. PATENT DOCUMENTS

| | | | |
|---|---|---|---|
| 3,634,149 | 1/1972 | Knippenberg et al. | 148/175 |
| 3,758,875 | 9/1973 | Hayashi | 357/17 |
| 3,812,516 | 5/1974 | Hayashi | 357/17 |
| 3,986,193 | 10/1976 | Vodakov et al. | 357/17 |
| 4,626,322 | 12/1986 | Switzer | 204/2.1 |
| 4,855,249 | 2/1989 | Akasaki et al. | 437/81 |
| 4,903,088 | 2/1990 | Van Opdorp | 357/17 |
| 4,918,497 | 4/1990 | Edmond | 257/77 |
| 5,005,057 | 4/1991 | Izumiya et al. | 357/17 |

FOREIGN PATENT DOCUMENTS

| | | | |
|---|---|---|---|
| 2738329 | 3/1978 | Germany | 357/61 |
| 58-64074 | 4/1983 | Japan | 357/17 |
| 61-182280 | 8/1986 | Japan | 357/17 |

OTHER PUBLICATIONS

Kressel et al., *Semiconductor Lasers and Heterojunction LEDs*, 1977, pp. 66–69.
Munch et al., "Silicon Carbide Light-Emitting Diodes with Epitaxial Junctions", *Solid-State Electronics*, (1976), 19:871–874.
Hoffmann et al., *Journal of Applied Physics*, 53(10), (Oct. 1982).
M. Ikeda et al., *Journal of Applied Physics*, 50(12), (Dec. 1979).
Hovel et al., *Appl. Phys. Lett.*, (1972), 20(2):71–73.
Pankove, *J. Luminescence*, (1973), 7:114–126.
Rutz, *Appl. Phys. Lett.*, (1976), 28(7):379–381.
Khan et al., *Appl. Phys. Lett.*, (1983), 43(5):492–494.
Ziegler et al., *IEEE Transactions on Electrical Devices*, (1981), ED-28(4):425–427.

*Primary Examiner*—Andrew J. James
*Assistant Examiner*—Stephen D. Meier
*Attorney, Agent, or Firm*—Morrison & Foerster

[57] ABSTRACT

A light emitting diode is disclosed which comprises at least one heterojunction composed of silicon carbide (SIC) and semiconductor materials selected from the group consisting of gallium nitride (GAN), aluminum nitride (AlN), and aluminum gallium nitride ($Ga_xAl_{1-x}N$, $0<x<1$).

3 Claims, 3 Drawing Sheets

LIGHT EMITTING DIODE

This application is a continuation, of application Ser. No. 07/648,234 filed Jan. 30, 1991, abandoned, which application is a continuation of Ser. No. 07/455,565, filed Dec. 22, 1989 abandoned.

BACKGROUND OF THE INVENTION

1. Field of the invention

This invention relates to a light emitting diode which can attain stable emission of light with a short wavelength from blue to ultraviolet.

2. Description of the prior art

In recent years, light emitting diodes have been widely used as a display element in various display devices because of their small size, low consumption of power, and stable emission of light with high brightness. Moreover, they have also been put to practical use as a light source for readout of the recorded data in various data processing apparatus. However, light emitting diodes which have been put to practical use so far are those capable of emitting light with a long wavelength from red to green, whereas diodes capable of emitting light with a short wavelength from blue to ultraviolet have not yet been realized.

The emission wavelength of a light emitting diode depends upon the kind of semiconductor materials to be used therein. The semiconductor materials for use in blue light emitting diodes are limited to silicon carbide (SIC, one of the IV—IV group compound semiconductors; Eg (forbidden band width)=3.0 eV for α-SiC), gallium nitride (GAN, one of the III-V group compound semiconductors; Eg=3.4 eV), zinc sulfide (ZnS, one of the II-VI compound semiconductors; Eg=3.7 eV), and zinc selenide (ZnSe, one of the II-VI group compound semiconductors; Eg=2.7 eV). Examples of the semiconductor materials for use in ultraviolet light emitting diodes include aluminum nitride (AlN, one of the III-V group compound semiconductors; Eg=6.0 eV) and aluminum gallium nitride ($Ga_xAl_{1-x}N$, $0<x<1$, one of the III-V group compound semiconductors; Eg=3.4 to 6.0 eV).

It is preferred that light emitting diodes are of p-n junction type. This is because electrons and positive holes can be injected into the emission area with high efficiency. However, it is difficult to prepare p-type crystals from the above-mentioned semiconductor materials other than SiC. Even if obtained, such p-type crystals are highly resistive or extremely unstable, so that p-n junction light emitting diodes cannot be produced using the p-type crystals of these semiconductor materials.

In contrast, both p-type and n-type crystals of SiC can readily be obtained, therefore, it is possible to produce light emitting diodes of p-n junction type. See, for example, M. Ikeda et al., J. Appl. Phys., Vol. 50, No. 12, p. 8215 (1979), and L. Hoffmann et al., J. Appl. Phys., Vol. 53, No. 10, p. 6962 (1982). FIG. 5 shows a conventional silicon carbide light emitting diode of the p-n junction type, which comprises a p-n junction formed of a p-SiC substrate 1 and an n-SiC layer 2, an ohmic electrode 6 for the p-SiC and an ohmic electrode 7 for the n-SiC being disposed on the back face of the p-SiC substrate 1 and the upper face of the n-SiC layer 2, respectively. However, the above-mentioned compound semiconductors other than SiC are suitable for light emission with high efficiency because of their direct band structure, whereas SiC has the drawback that even if light emitting diodes of p-n junction type are produced with the use of SiC, their luminous efficiency is low because SiC is one of the indirect band gap materials, therefore, such silicon carbide light emitting diodes cannot be used for practical applications.

SUMMARY OF THE INVENTION

The light emitting diode of this invention, which overcomes the above-discussed and numerous other disadvantages and deficiencies of the prior art, comprises at least one heterojunction composed of silicon carbide (SiC) and semiconductor materials selected from the group consisting of gallium nitride (GAN), aluminum nitride (AlN), and aluminum gallium nitride ($Ga_xAl_{1-x}N$, $0<x<1$).

In a preferred embodiment, the polytype of the silicon carbide is selected from α-type and β-type.

In a preferred embodiment, the above-mentioned light emitting diode comprises a substrate of a first conductivity type made of silicon carbide (SIC) and a first semiconductor layer of a second conductivity type made of a semiconductor material selected from the group consisting of gallium nitride (GAN), aluminum nitride (AlN), and aluminum gallium nitride ($Ga_xAl_{1-x}N$, $0<x<1$).

In a preferred embodiment, a second semiconductor layer of a second conductivity type made of silicon carbide (SIC) is interposed between the substrate and the first semiconductor layer.

In a preferred embodiment, the above-mentioned light emitting diode comprises a substrate of a first conductivity type made of a semiconductor material selected from the group consisting of gallium nitride (GAN), aluminum nitride (AlN), and aluminum gallium nitride ($Ga_xAl_{1-x}N$, $0<x<1$), and a first semiconductor layer of a second conductivity type made of silicon carbide (SIC).

In a more preferred embodiment, a second semiconductor layer of a first conductivity type made of silicon carbide (SIC) is interposed between the substrate and the first semiconductor layer.

Thus, the invention described herein makes possible the objectives of (1) providing a light emitting diode which can attain stable emission of light with a short wavelength from blue to ultraviolet with high efficiency; and (2) providing a light emitting diode which can attain multi-coloration of the display portion in various display devices as well as high-speed and high-density readout of the recorded data in various data processing apparatus with light emitting diodes used as a light source, thereby allowing significant expansion of the application field of light emitting diodes.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

In general, a heterostructure composed of different substances has a tendency to cause strains, stresses, and various lattice defects at the interface between the substances because of the difference in the lattice constant of the respective substances. Even if such a heterostructure is used to produce a light emitting diode, the device characteristics of the diode obtained are significantly poor. In the present invention, SiC (lattice constant a=3.08 Å) and the other semiconductor material which has a lattice constant very close to that of SiC, such as GaN (a=3.19 Å), AlN (a=3.11 Å), or $Ga_xAl_{1-x}N$ (a=3.11 to 3.19 Å), are used to form a heterostructure, so that short-wavelength light emitting diodes with excellent characteristics can be obtained.

A light emitting diode of this invention has a p-n junction of heterostructure which is composed of p-SiC and an n-type semiconductor material such as n-GaN, n-AlN, or $n-Ga_xAl_{1-x}N$, and it emits light from the n-type semiconductor material with a direct band gap such as n-GaN, n-AlN, or $n-Ga_xAl_{1-x}N$, so that high luminous efficiency can be achieved.

Another light emitting diode of this invention has not only a p-n junction composed of p-SiC and n-SiC but also a heterojunction composed of n-SiC and an n-type semiconductor material such as n-GaN, n-AlN, or $n-Ga_xAl_{1-x}N$. Such a device structure can allow the confinement of carriers injected from the p-SiC to the n-SiC by an energy barrier at the heterojunction, thereby attaining high luminous efficiency.

The invention will be further explained with reference to the following examples.

EXAMPLE 1

Figure 1:
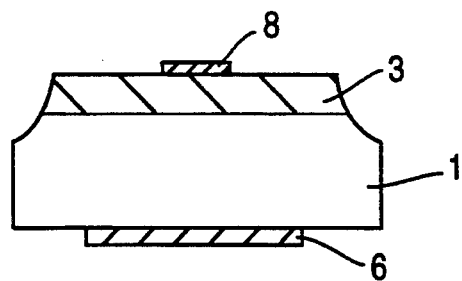
FIG. 1 is a sectional view of a light emitting diode of this invention.

FIG. 1 shows a light emitting diode of this invention, comprising a p-SiC substrate 1 and an n-GaN layer 3 formed thereon, both of which constitute a p-n junction of heterostructure. On the back face of the p-SiC substrate 1 and the upper face of the n-GaN layer 3, a p-sided ohmic electrode 6 and an n-sided ohmic electrode 8 are formed, respectively. In order to reduce the surface leakage current, a mesa structure was adopted with a technique of mesa etching. To the p-SiC substrate 1, aluminum (Al) was added as an acceptor dopant of p-type. The density of positive holes in the p-SiC substrate 1 is in the order of 1018 to $10^{19}$ cm$^{-3}$. The n-GaN layer 3 is an undoped n-type film. The density of electrons in the n-GaN layer 3 is in the order of $10^{16}$ to $10^{17}$ cm$^{-3}$. To the n-GaN layer 3, zinc (Zn) was added as a luminescent center for blue color.

The light emitting diode of this example was produced as follows: On the p-SiC substrate 1 with a thickness of about 500 μm, the n-GaN layer 3 was grown by metal-organic chemical vapor deposition (MOCVD) using trimethyl gallium $(Ga(CH_3)_3)$ and ammonia $(NH_3)$ as a source material. The growth temperature was about 1,000° C. The n-GaN layer 3 was allowed to contain Zn serving as a luminescent center by the addition of zinc diethyl $Zn(C_2H_5)_2$ as a source material during the growth.

Figure 2A:
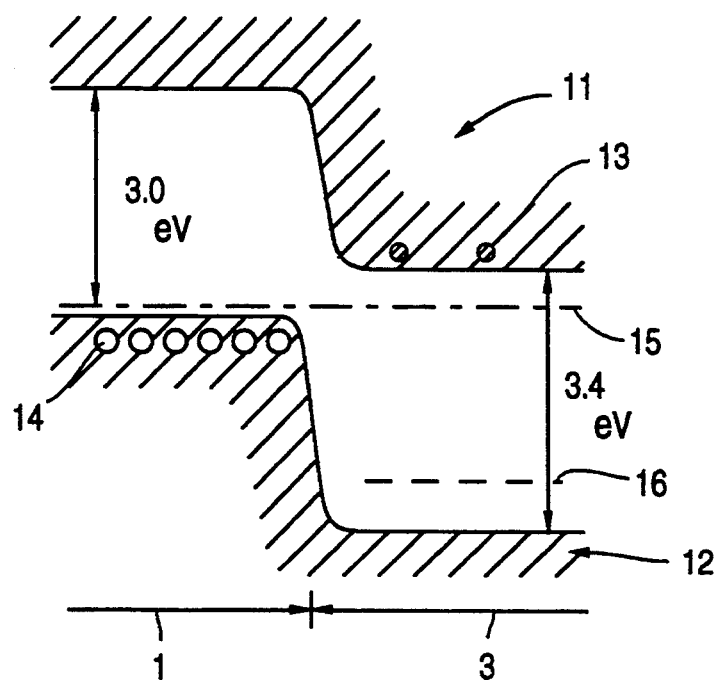
FIGS. 2a and 2b are schematic diagrams showing energy bands of the light emitting diode of FIG. 1 when a bias voltage is not applied thereto and when it is applied thereto, respectively.

FIG. 2a shows an energy band diagram of the light emitting diode of this example when a bias voltage is not applied thereto. The Fermi level of the p-SiC substrate 1 is the same as that of the n-GaN layer 3. There exist positive holes 14 in the valence band 12 of the p-SiC substrate 1, while there exist electrons 13 in the conduction band 11 of the n-GaN layer 3. These electrons 13 and positive holes 14 can never be combined with each other because of an energy barrier at the interface between the p-SiC substrate 1 and the n-GaN layer 3.

Figure 2B:
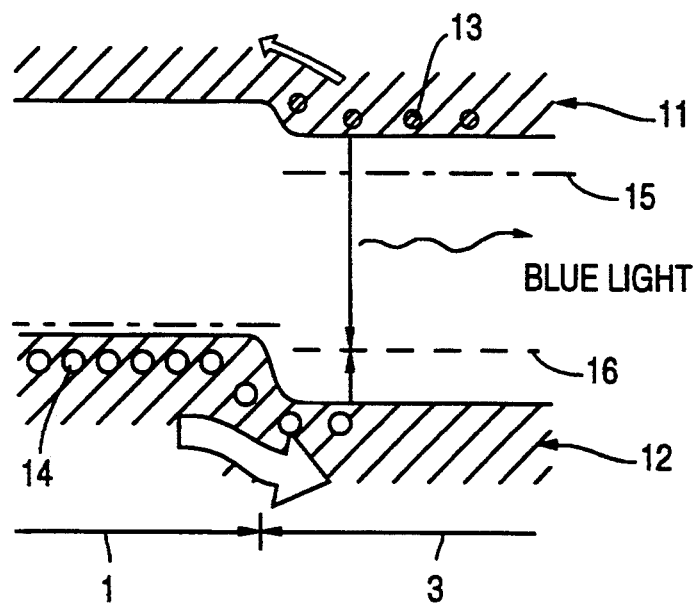

FIG. 2b shows an energy band diagram of the light emitting diode of this example when a forward bias voltage is applied thereto. In this case, a positive voltage is applied to the side of the p-SiC substrate 1. When a forward bias voltage is applied thereto, an energy barrier at the interface between the p-SiC substrate 1 and the n-GaN layer 3 is lowered, so that the electron 13 in the conduction band 11 and the positive hole 14 in the valence band 12 are recombined with each other, resulting in light emission. Because the density of positive holes in the p-SiC substrate 1 is set at a value sufficiently greater than that of electrons in the n-GaN layer 3, carrier injection occurring in the vicinity of the p-n junction is directed from the p-SiC substrate 1 to the n-GaN layer 3. Thus, the positive hole 14 injected in the n-GaN layer 3 recombines with the electron 13 through the Zn luminous center 16, thereby attaining light emission. The light emitting diode of this example emitted blue light with a wavelength of 450 nm. The luminous efficiency thereof amounted 0.5% in terms of external quantum efficiency. Moreover, light emission was stably obtained from the entire surface of the device.

EXAMPLE 2

Figure 3:
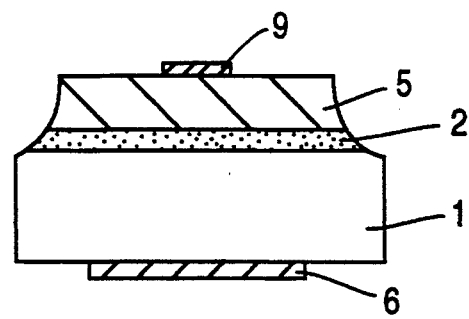
FIG. 3 is a sectional view of another light emitting diode of this invention.
Figure 5:
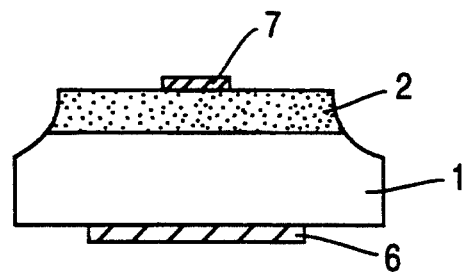
FIG. 5 is a sectional view of a conventional short-wavelength light emitting diode.

FIG. 3 shows another light emitting diode of this invention, successively comprising a p-SiC substrate 1, an n-SiC layer 2, and an n-AlN layer 5. On the back face of the p-SiC substrate 1 and the upper face of the n-AlN layer 5, a p-sided ohmic electrode 6 and an n-sided ohmic electrode 9 are formed, respectively. In order to reduce a surface leakage current, a mesa structure was adopted with the use of a technique of mesa etching. To the p-SiC substrate 1, aluminum (Al) was added as an acceptor dopant of p-type. The density of positive holes in the p-SiC substrate 1 is in the order of $10^{18}$ to $10^{19}$ cm$^{-3}$. To the n-SiC layer 2, nitrogen (N) was added as a donor dopant and aluminum (Al) was also added as an acceptor dopant in an appropriate amount at the same time. The density of electrons in the n-SiC layer 2 was in the order of $10^{16}$ to $10^{17}$ cm$^{-3}$. The n-AlN layer 5 is an undoped n-type layer to which no dopants was added in particular. The density of electrons in the n-AlN layer 5 is in the order of $10^{17}$ cm$^{-3}$.

The light emitting diode of this example was produced as follows: On the p-SiC substrate 1 with a thickness of about 500 μm, the n-SiC layer 2 with a thickness of about 2 μm was grown by chemical vapor deposition (CVD) using monosilane $(SiH_4)$ and propane $(C_3H_8)$ as a source material. The growth temperature was about 1,300° C. The n-SiC layer 2 was allowed to contain N and Al by the addition of nitrogen $(N_2)$ and trimethylaluminum $(Al(CH_3)_3)$ as source materials during the growth. Subsequently, the n-AlN layer 5 with a thickness of about 10 μm was grown on the n-SiC layer 2 by chemical vapor deposition (CVD) using trimethylaluminum $(Al(CH_3)_3)$ and ammonia $(NH_3)$ as source materials. The growth temperature was about 1,000° C.

Figure 4A:
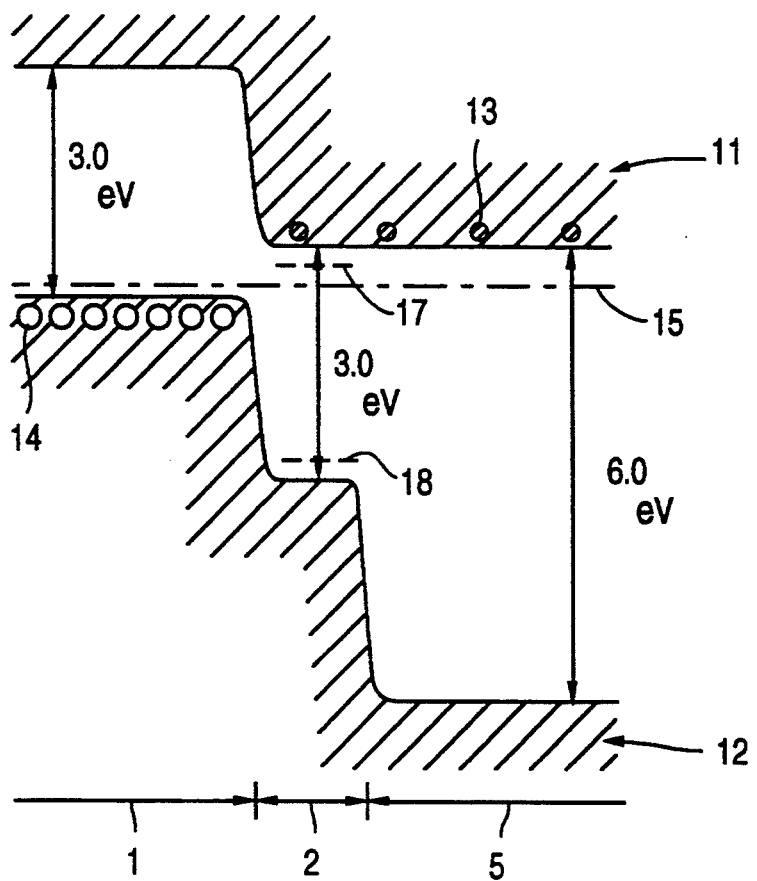
FIGS. 4a and 4b are schematic diagrams showing energy bands of the light emitting diode of FIG. 3 when a bias voltage is not applied thereto and when it is applied thereto, respectively.

FIG. 4a shows an energy band diagram of the light emitting diode of this example when a bias voltage is not applied thereto. The p-SiC substrate 1, the n-SiC layer 2, and n-AlN layer 5 have the same Fermi level. There exist positive holes 14 in the valence band 12 of the p-SiC substrate 1, while there exist electrons 13 in the conduction band 11 of the n-SiC layer 2 and the n-AlN layer 5. These electrons 13 and positive holes 14 can never be combined with each other because of an energy barrier at the interface between the p-SiC substrate 1 and the n-SiC layer 2.

Figure 4B:
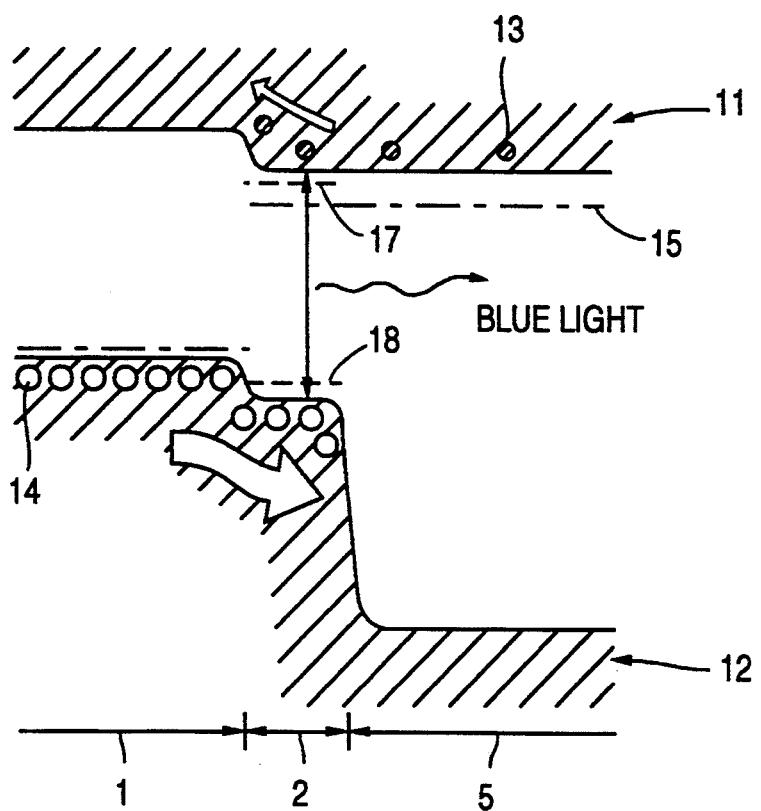

FIG. 4b shows an energy band diagram of the light emitting diode of this example when a forward bias voltage is applied thereto. In this case, a positive voltage is applied to the side of the p-SiC substrate 1. When a forward bias voltage is applied thereto, an energy barrier at the interface between the p-SiC substrate 1 and the n-SiC layer 2 is lowered, so that the electron 13 in the conduction band 11 and the positive hole 14 in the valence band 12 are recombined with each other, resulting in light emission. Because the density of positive holes in the p-SiC substrate 1 is set at a value sufficiently greater than that of electrons in the n-SiC layer 2, carrier injection occurring in the vicinity of the p-n junction is directed from the p-SiC substrate 1 to the n-SiC layer 2. The positive hole 14 injected in the n-SiC layer 2 from the p-SiC substrate 1 is confined in the n-SiC layer 2 with a thickness of about 2 μm because of a large energy barrier between the n-SiC layer 2 and the n-AlN layer 5, so that it can sufficiently recombine with the electron 13, thereby attaining light emission. The recombination of the electron 13 and the positive hole 14 is associated with donor-acceptor pair light emission between the nitrogen donor 17 and the aluminum acceptor 18. The light emitting diode of this example emitted blue light with a wavelength of 470 nm. The quantum efficiency thereof was 0.2%, indicating high luminous efficiency.

Although the above-mentioned examples disclose that a GaN or AlN layer is grown on The substrate made of SiC, directly or with the interposition of an SiC layer, to form a heterojunction, the heterojunction may also be formed by growing a SiC layer on the substrate made of GaN or AlN. Moreover, although in the above-mentioned examples, α-SiC with a large Eg (=3.0 eV) is used for silicon carbide β-SiC with a small Eg (=2.3 eV) may also be used. In this case, the light emitting diode of Example 2 will emit light of from reddish orange to green instead of blue light.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A light emitting diode comprising at least one heterojunction including a p-type silicon carbide (SIC) and an n-type semiconductor material selected from the group consisting of gallium nitride (GAN), aluminum nitride (AlN), and aluminum gallium nitride ($Ga_xAl_{1-x}N$, $0<x<1$), a density of positive holes in said p-type silicon carbide being in the order of $10^{18}$ to $10^{19}$ $cm^{-3}$; and a density of electrons in said n-type semiconductor material being in the order of $10^{16}$ to $10^{17}$ $cm^{-3}$.

2. A light emitting diode according to claim 1, wherein said n-type semiconductor material is formed by chemical vapor deposition.

3. A light emitting diode comprising at least one heterojunction including:
   a substrate made of a p-type silicon carbide (SiC);
   a first n-type semiconductor layer made of silicon carbide, formed on said substrate; and
   a second n-type semiconductor layer made of a semiconductor material selected from the group consisting of gallium nitride (GAN), aluminum nitride (AlN), and aluminum gallium nitride ($Ga_xAl_{1-x}N$, $0<x<1$), formed on said first n-type semiconductor layer, a density of positive holes in said substrate being in the order of $10^{18}$ to $10^{19}$ $cm^{-3}$, a density of electrons in said first n-type semiconductor layer being in the order of $10^{16}$ to $10\ 17$ $cm^{-3}$, a density of electrons in said second n-type semiconductor layer being in the order $10^{17}$ $cm^{-3}$.

* * * * *

UNITED STATES PATENT AND TRADEMARK OFFICE
CERTIFICATE OF CORRECTION

PATENT NO. : 5,387,804
DATED : February 7, 1995
INVENTOR(S) : Akira Suzuki, et. al.

It is certified that error appears in the above-indentified patent and that said Letters Patent is hereby corrected as shown below:

In column 1, line 31, please change "SIC" to --SiC--.

In column 2, line 21, please change "(SIC)" to --(SiC)--.

In column 2, line 24, please change "(GAN)" to --(GaN)--.

In column 2, line 29, please change "(SIC)" to --(SiC)--.

In column 2, line 35, please change "(GAN)" to --(GaN)--.

In column 2, line 38, please change "(SIC)" to --(SiC)--.

In column 2, line 41, please change "(SIC)" to --(SiC)--.

In column 3, line 54, please change "1018" to --$10^{18}$--.

Col. 6,   In claim 1, line 2, please change "(SIC)" to --(SiC)--.

Col. 6,   In claim 1, line 4, please change "(GAN)" to --(GaN)--.

Col. 6,   In claim 3, line 8, please change "(GAN)" to --(GaN)--.

Signed and Sealed this

Twenty-sixth Day of September, 1995

*Attest:*

BRUCE LEHMAN

*Attesting Officer*     *Commissioner of Patents and Trademarks*